United States Patent [19]

Barth et al.

[11] Patent Number: 6,044,024
[45] Date of Patent: *Mar. 28, 2000

[54] INTERACTIVE METHOD FOR SELF-ADJUSTED ACCESS ON EMBEDDED DRAM MEMORY MACROS

[75] Inventors: John E. Barth; Jeffrey H. Dreibelbis, both of Williston; Howard L. Kalter, Colchester, all of Vt.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/007,433

[22] Filed: Jan. 14, 1998

[51] Int. Cl.[7] .............................. G11C 16/04; G11C 7/02
[52] U.S. Cl. .............................. 365/189.08; 365/189.01; 365/210
[58] Field of Search .................. 365/189.08, 189.01, 365/194, 210, 238.5; 395/875

[56] References Cited

U.S. PATENT DOCUMENTS

| | | | |
|---|---|---|---|
| 3,715,737 | 2/1973 | Grundy | 340/174 |
| 3,959,781 | 5/1976 | Mehta et al. | 340/173 |
| 4,363,111 | 12/1982 | Heightley et al. | 365/210 |
| 4,435,793 | 3/1984 | Ochii | 365/233 |
| 5,132,931 | 7/1992 | Koker | 365/210 |
| 5,268,869 | 12/1993 | Ferris et al. | 365/210 |
| 5,325,337 | 6/1994 | Buttar | 365/210 |
| 5,383,155 | 1/1995 | Ta | 365/191 |
| 5,414,663 | 5/1995 | Komarek et al. | 365/210 |
| 5,471,428 | 11/1995 | Baroni et al. | 365/201 |
| 5,502,681 | 3/1996 | Park | 365/210 |
| 5,596,539 | 1/1997 | Passow et al. | 365/210 |
| 5,713,011 | 1/1998 | Satoh et al. | 395/556 |

*Primary Examiner*—David Nelms
*Assistant Examiner*—Anh Phung
*Attorney, Agent, or Firm*—DeLIO & Peterson, LLC; Peter W. Peterson; Robert A. Walsh

[57] ABSTRACT

An embedded memory macro device includes a memory system and a logic circuit constructed on a common semiconductor substrate. The memory system and logic circuit communicate through a handshake procedure via a system data interlock signal. During read cycles the memory system uses the system data interlock signal to tell the logic circuit when data at memory system data outputs is valid. In the preferred embodiment, during write cycles the memory system uses the system data interlock signal to tell the logic circuit when data has been successfully written. The logic circuit needs to wait only until the system data interlock signal permits it to proceed. It then signals the memory system to reset the system data interlock signal and can immediately initiate a new read or write cycle.

20 Claims, 4 Drawing Sheets

INTERACTIVE METHOD FOR SELF-ADJUSTED ACCESS ON EMBEDDED DRAM MEMORY MACROS

BACKGROUND OF THE INVENTION

1. Field of the Invention

This invention relates to logic and memory devices in which a memory system for storing data is constructed on a common semiconductor substrate with a logic circuit that accesses data stored by the memory system.

2. Description of Related Art

There are numerous applications in which a digital logic circuit needs to use data stored in a memory system. In the majority of these applications, the memory system is constructed on a separate memory chip designed with a standardized set of inputs and outputs through which the data must be accessed. These standardized inputs and outputs allow the memory chip to be used for different applications, but they limit the communication between the memory system and the logic circuit.

A logic circuit for performing a particular digital function is commonly referred to as a "macro". In order to reduce cost, newer digital designs may have the memory system constructed on a common substrate with the logic circuit, and such a device is referred to herein as an embedded memory macro. Individual macros may be combined and constructed on a single substrate to create a more complex digital circuit. Alternatively, the individual macros may be constructed as separate devices.

Although embedded memory macro designs are known, they have heretofore used the same standardized set of inputs and outputs for communication between the embedded memory system and the associated logic circuitry. That standardized interface prevents the memory system from signaling to the logic circuit when data that has been read from the memory has become valid, even though newer memory system designs have this information internally available to the memory system.

Accordingly, one object of the present invention is to improve embedded memory macro performance by communicating additional information between the memory system and the logic circuit. This object is achieved by taking advantage of the fact that an embedded memory system is constructed on the same substrate as the logic circuitry, allowing the interface between the two to be improved and to carry more information.

In a conventional macro, where the memory and logic are on separate chips, the memory will have been tested after construction and certified to meet certain specifications. The macro can be designed with these memory specifications in mind and the memory and the macro can be matched. In an embedded memory macro, however, this matching cannot be done. The embedded memory macro needs to be designed with the possibility that there will be variations in the memory system performance. This has required either very conservative design, resulting in less than optimum performance for the macro, or complex initialization and testing of the memory by the macro at startup to adjust macro operation to the memory system performance.

Accordingly, another object of the invention is to avoid the necessity for complex initialization and testing of the memory system by the macro to compensate for variations in memory system performance. This object can also be achieved through improving the interface and communication between the memory system and the logic circuit.

The present invention contemplates the use of a newer type of memory system which uses internal signals, usually referred to as "interlock signals" or "dummy data line" signals, for controlling the flow of data in the memory system. U.S. Pat. No. 5,383,155 issued to Ta on Jan. 17, 1995, is illustrative of one application of an interlocked design.

The interlock signals, which have heretofore been used only for read operations and which have only been used internally within the memory system, are used in the present invention to construct a system interlock signal that tells the logic circuitry when the memory system has successfully completed a read operation. The design of the logic circuit is adjusted to allow this information to be used to optimize performance of the embedded memory macro.

Yet another object of the invention relates to improving performance of the embedded memory macro during the write operation. The design of the memory system is adjusted to monitor the write operation as well as the read operations and to produce an interlock signal indicating when a write operation has been successfully completed. This allows the memory system to provide information concerning the write operation to the logic circuit, allowing the logic circuit to adjust its write and read cycles accordingly.

Because it is relatively easy to design the write operation of a memory system to be at least as fast as the read operation, memory systems have not previously been designed to use interlock signals during the write operation in the way that they have been used during the read operation. Further, there has been little incentive to improve the write operation speed beyond the speed of the read operation when both operations are designed simply to be completed within a defined access time.

In the preferred design of the present invention the logic circuit uses the information provided by the memory system about the successful completion of each individual read/write operation to speed up or slow down the subsequent memory operation. This allows the entire macro to constantly run at the optimum speed. This results in a system that is far superior to a non-embedded memory macro design, even where the separate memory system has been carefully matched to the logic circuit.

Specifically, the embedded memory macro of this invention self-adjusts and varies its performance for each individual read or write operation to optimally match the performance of the memory system. The matching occurs regardless of whether the variation of the memory system is the result of manufacturing process variations, ambient operating environment variations, or task speed variations depending upon where in the array of memory cells in the memory system the data is being stored.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an embedded memory macro device including a semiconductor substrate and a memory system constructed on the semiconductor substrate with a logic circuit. The memory system includes an array of memory cells for storing data, a data output for making data available after data has been read from the memory cells, and a system data interlock output having a system data interlock signal indicating the presence or absence of valid data at the data output. The logic circuit is connected to the data output and the system data interlock output, and reads data at the data output only after the system data interlock signal indicates the presence of valid data at the data output.

In another aspect of the invention, the logic circuit defines macro cycles during which data is read from the memory system, and the logic circuit includes a macro select output having a macro select signal indicating a new macro cycle. The memory system is connected to the macro select output and resets the system data interlock signal to indicate the absence of valid data at the data output responsive to the macro select signal.

In yet another aspect of the invention, the memory system retrieves a block of data from the memory cells during a macro cycle and the logic circuit defines page cycles during which a subset of the block of data retrieved by the memory system is read by the logic circuit. The logic circuit includes a page select output having a page select signal indicating a new page cycle, and the memory system is connected to the page select output and resets the system data interlock signal to indicate the absence of valid data at the data output responsive to the page select signal.

In the most highly preferred embodiment of the invention, the memory system uses the system data interlock signal during write operations, as well as read operations, to signal the logic circuit when data has been validly written into the memory cells

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
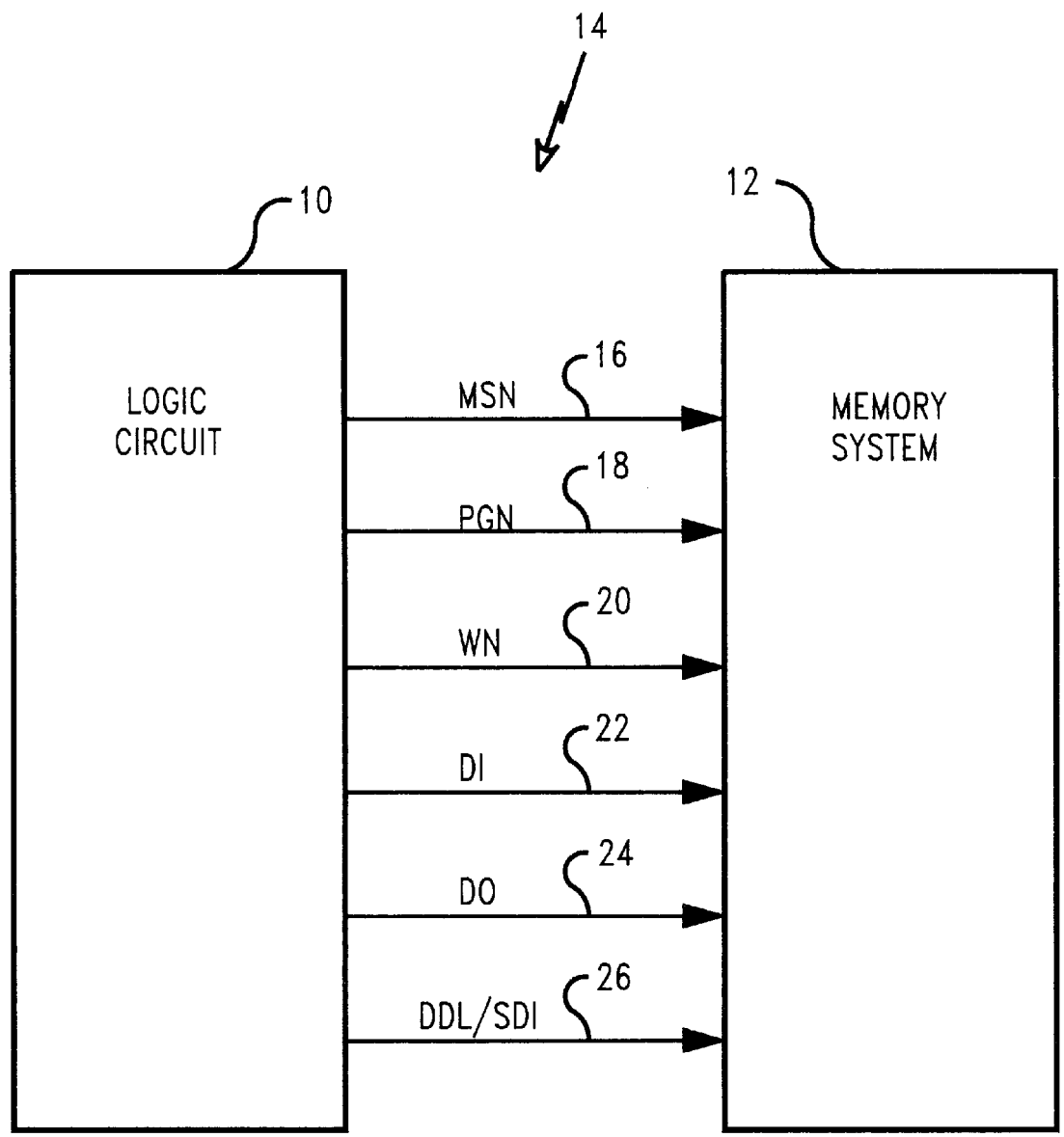
FIG. 1 is a block diagram illustrating selected portions of the interface between a logic circuit and a memory system constructed in accordance with the present invention.

In describing the preferred embodiment of the present invention, reference will be made herein to FIGS. 1–5 of the drawings in which like numerals refer to like features of the invention.

A more complete understanding of the invention may best be achieved by a consideration of a prior art memory system having a conventional interface. Such memory systems are designed for read operations and write operations that will occur within a specified access time for the memory system. After the memory system is constructed, it is tested and certified for use within certain operating parameters to read or write data within the specified access time.

Using good design techniques, it is relatively easy for the memory system designer to ensure that the cycle time for write operations is at least as fast as the time for read operations, thus the designer is most concerned with improving read operation performance and has previously had relatively little incentive to improve write operation speed if the speed of read operations cannot be increased correspondingly.

The time it takes for a read or write operation to be successfully completed by a memory system can vary widely. The variations, however, can be generally attributed to three different factors. One factor ("process variations") relates to variations in the manufacturing process that result in faster or slower memory system performance.

A second factor ("application variations") relates to variations in the particular application and operating conditions, such as the ambient temperature in which the circuit is operating or the voltage of the power supply chosen to power the circuit. The third factor ("task variations") relates to variations in the particular task being performed by the memory system, such as where within the memory array the data is being stored, and the distance of the storage location from the memory system inputs and outputs.

In both embedded memory systems and separate memory systems, data moves sequentially through several intermediate stages as it moves between the data inputs/outputs and the memory cells where it is stored. These intermediate steps may include data registers which have to latch, amplifiers where the output has to stabilize, etc. The data must travel along internal data lines which take time to change state, and there may be other internal processing by the memory system, such as address comparisons, before the data finally arrives at its destination. A similar sequence of steps occurs during a write operation.

It is the cumulative delay from all of these steps, as set by the three factors that affect the individual delays, which controls the total time it takes for any particular read or write operation to be completed. The memory system designer must be careful with the timing of each successive step in the processing of data as it is moved to and from the memory cells where it is stored to ensure that each step waits until the previous step is successfully completed. If a step operates too soon, invalid data from the preceding step will be processed and the resulting operation will fail.

In older memory system designs, the designer inserted delays at each step before the next step was permitted to proceed. The delay was chosen to be the worst case delay for the previous step to ensure that valid data had arrived before the next step in the process was initiated.

A specific example is the delay necessary to ensure that a data bit of unknown value stored in the most distant memory cell has been successfully retrieved. A data line leading to that distant cell has an initial binary state, and if the unknown data is in the opposite binary state, the data line must change, taking longer than if its state did not have to change. The more distant the memory cell is the longer it takes for the change of state to occur.

To avoid this type of problem, the memory system designer inserted a relatively long constant delay before using retrieved data on a data line. The delay was chosen to be sufficiently long to accommodate the case where the data was located in the most distant location, and where it was data that would have to change the state of the data line.

This delay was far longer than necessary for the majority of cases where the data would be located closer than the most distant location. Where there are multiple steps, each with such a worst case delay, the delays add up, resulting in far less than optimum performance for the memory system.

To improve performance, newer memory system designs have used interlock signals at one or more steps in the read operation. In interlocked designs, the memory system is constructed so that a dummy operation runs in parallel with one or more real operations to be monitored. The dummy operation is designed to be as similar as possible to the real operations it monitors, but is set so that in every case it will take at least as long to finish as the longest real operation it monitors.

Process and application variations affect the real and dummy operations equally, automatically adjusting internal performance for these variations. The result of the dummy operation is monitored, producing the interlock signal (also referred to as a "dummy data line" signal). When the dummy operation has been successfully completed, it is known that all of the associated real operations have also been completed. Because there is a different dummy operation for each monitored task, a faster task (such as retrieval of data from a close data storage location) automatically runs faster and the next step in the memory system can proceed immediately.

It should be understood that interlock signals can be used for monitoring many different tasks required in a memory system. Ideally, each step in the processing of the data will be interlocked from proceeding by the dummy monitoring of the previous step. The successful completion of the preceding step trips the succeeding step to begin at the earliest possible time.

While this type of interlocking design allows the memory system to run optimally, and to get the data from storage to the outputs as quickly as possible, the standardized interface to the memory system has not heretofore allowed the memory system to signal the logic circuit that the read has been successfully completed.

Thus, while the interlocking helps to ensure that data will arrive at the outputs as quickly as possible, there is no advantage to overall performance if it arrives before the specified access time of the memory system. Further, there is no way of signaling the logic circuit to wait if, under extremes of operating condition, e.g., low voltage supply and high ambient temperature, the specified access time for the memory system is inadvertently exceeded.

In the former case, the logic circuit must wait, even though data is already available, and in the latter, the logic circuit will proceed with invalid data despite the fact that the memory system knows, via the last interlock signal, that the data is not yet ready for use.

FIG. 1 provides a block diagram illustrating a logic circuit 10 and a memory system 12 constructed upon a common substrate (not shown) in accordance with the present invention. The two circuits 10, 12 communicate with each other through an interface comprising a set of inputs and outputs (I/O's) generally indicated with reference numeral 14.

The I/O's shown in FIG. 1 include:
Macro Select (MSN) 16,
Page Select (PGN) 18,
Write Enable (WN) 20,
Data In (DI) 22,
Data Out (DO) 24, and
System Data Interlock (DDL/SDI) 26

The first five signals listed above (MSN, PGN, WN, DI and DO) are a subset of a more complete standard interface which would also include multiple additional data input lines (corresponding to DI 22), multiple additional data output lines (corresponding to DO 24) and address lines. These lines will also be found in a device constructed according to this invention, but are not shown, as their functions are well known and are unchanged in this application.

The system data interlock signal DDL/SDI 26 is an additional line, not found in the prior art interface, and it is this additional line which allows the improved performance of this invention, provided that appropriate modifications to the logic circuit and memory system are also made to provide and utilize this information.

The write enable line (WN) 20 is an input to the memory system 12 and is used by the logic circuit to advise the memory system whether this cycle is a write operation or a read operation.

During a write operation, the logic circuit will put a bit of data onto the data input line DI 22. Typically, there will also be numerous additional data input lines so that a block of data can be written, not just the single data bit on DI 22. The logic circuit is also responsible for specifying the address where the data should be stored on address lines (not shown).

During a read operation, the logic circuit will read a data bit from the data output line DO 24 (and from additional data outputs corresponding to DO 24). The logic circuit is again responsible for specifying the address from which the data should be retrieved on address lines (not shown).

The macro select signal (MSN) 16 is the input to the memory system 12 that allows the logic circuit to signal that a new read or write operation is beginning. The logic circuit is responsible for correctly setting the write enable line WN (to tell the memory system 12 that this is a read or write cycle), putting the correct address on the address lines, and otherwise preparing for the new cycle before changing the state of the MSN line to initiate a new cycle.

In a prior art design, the logic circuit designer would have been required to wait the specified access time of the memory system before using the MSN signal to start a new read or write cycle. The memory system designer would have been responsible for ensuring that valid data was available at the data outputs during a read operation, or that a write operation had been successfully completed, within the specified access time after MSN signaled the beginning of a new cycle.

In the present invention, the logic circuit monitors the DDL/SDI system data interlock signal. This signal is an output from the memory system (derived from internal memory system interlock signals) that signals when a read operation, and preferably also a write operation, has successfully been completed. When DDL/SDI changes state, the logic circuit can proceed with a new cycle.

The page select signal PGN 18 is also an input to the memory system 12 and acts in much the same way as MSN to signal a new read or write cycle. During a read operation, when MSN signals a new read cycle, the memory system will retrieve an internal block of data that exceeds the number of data outputs connected to the logic circuit. This block of data is stored internally by the memory system and can be rapidly accessed, but only a subset of the data forming a page of data is available at any one time due to the limited number of outputs.

If the next read operation is reading data close to the data read in the previous operation, i.e. the higher order bits of the address are the same as for the previous data read operation, the new data to be read will be part of the block of data previously read and can be more rapidly accessed than if a new block of data must be read. In this case, a new page of data can very rapidly be accessed from the internal register by changing the lower order address bits to point to the new page of data, then cycling PGN instead of MSN.

Figure 2:
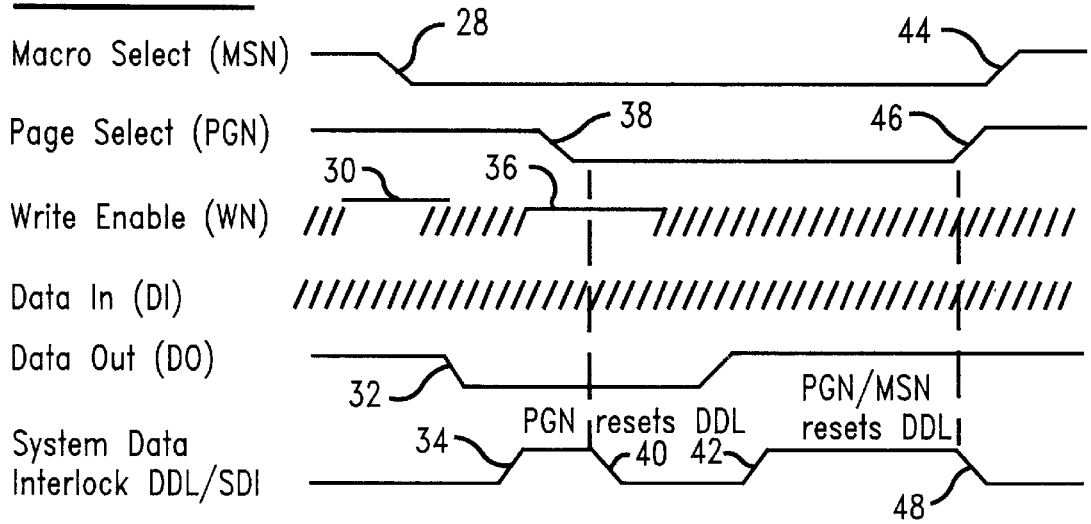
FIG. 2 is a timing diagram showing selected signals at various points in the embedded memory macro device of the present invention during a read operation.
Figure 3:
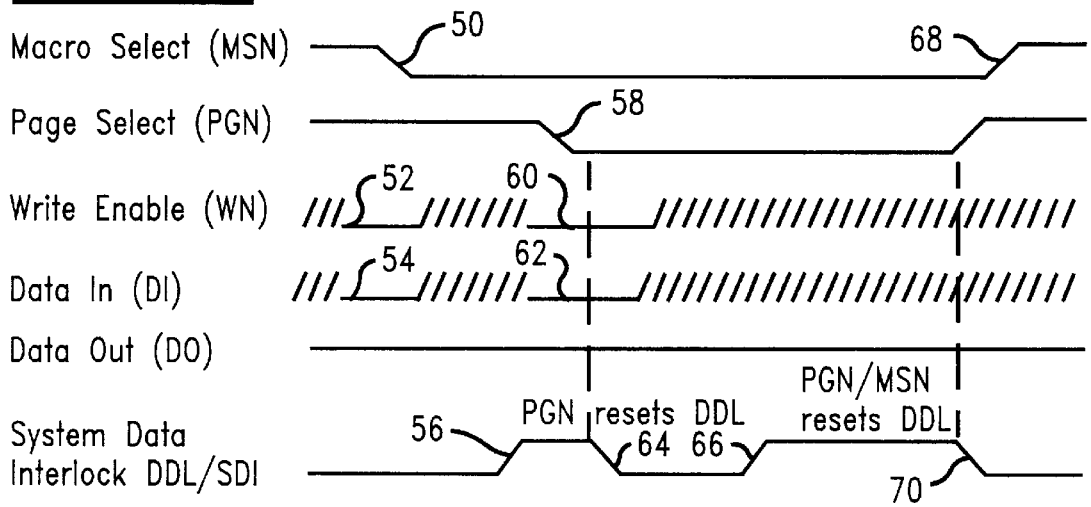
FIG. 3 is a timing diagram showing selected signals at various points in the embedded memory macro device of the present invention during a write operation.
Figure 4:
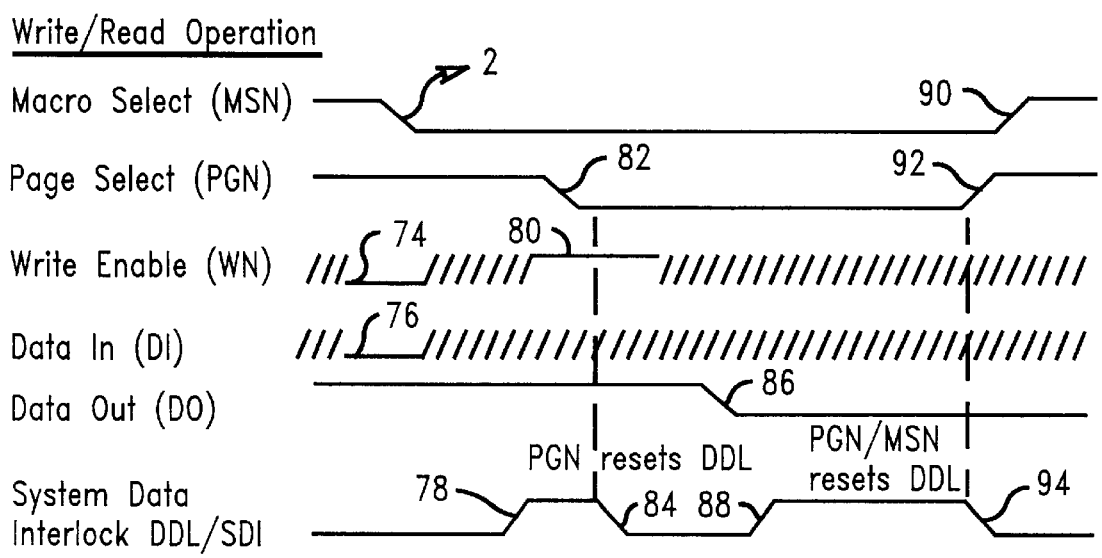
FIG. 4 is a timing diagram showing selected signals at various points in the embedded memory macro device of the present invention during a read/write operation.

FIGS. 2–4 illustrate the signals on the interface lines shown in FIG. 1 during a read operation (FIG. 2), a write operation (FIG. 3) and a combined write/read operation (FIG. 4).

In FIG. 2, the MSN signal changes state at the time indicated with reference numeral 28 to signal the start of a read operation in a new macro cycle. Prior to this time, the logic circuit will have placed the address to be read on the address lines, and will have set write enable WN high (at time 30) indicating that this is to be a read operation, not a write operation.

Upon sensing the change of state of the MSN signal at time 28, the memory system 12 will determine the memory address to be accessed, and retrieve data from that location, placing the retrieved data upon the data output line DO at time 32. Shortly thereafter, when the memory system has determined that the data has become valid at the data output line DO, the memory system changes the state of the system data interlock signal on the DDL/SDI line 26. This occurs at time 34.

The system data interlock signal signals the logic circuit 10 that the data is now valid and can be safely read from the data output DO. In some implementations of this invention, the system data interlock signal may be derived from a single interlock signal, such as the dummy data line signal, used to monitor the read operation in prior art interlocked memory devices.

In other implementations of this invention, the system data interlock signal may be derived from the last interlock signal in a cascaded series of interlock signals as described previously. Further, there may be some processing of the signal, additional delaying of the signal, or other combination and modification of prior art interlock signals to produce the final system data interlock signal.

Regardless of how the macro designer creates the DDL/SDI system data interlock signal, when it changes state, it indicates to the logic circuit that the output data is valid and the logic circuit can proceed to read the data and begin a new read cycle.

The slashes in the data input signal and during portions of the write enable WN signal merely indicate that the memory system does not care about the signal state on these lines at these times.

At time 36 the logic circuit ensures that the write enable signal WN is high and a new address is placed on the address lines. At this point the logic circuit is about to initiate a new read operation. This read operation will be a new page cycle to read a new page of data, instead of a new macro cycle to read an entirely new block of data.

In FIG. 2, the reading of a new page of data is initiated at time 38 by changing the state of PGN. During the macro cycle initiated at time 28, the memory system retrieved a block of data larger than the amount of data that could be output at the data outputs. In this page cycle, another subset/page of this large block of data will be output.

The logic circuit only needs to change the low order bits on the address lines and to set up the WN line for the read cycle of a new page of data. If data at a significantly different memory location must be read, the logic circuit would have had to change the higher order bits on the address line, and the read cycle would have been initiated by starting a new macro cycle through MSN.

When the page select signal PGN on line 18 changes state at time 38, the memory system resets the DDL/SDI signal, as shown at 40. This resets the system data interlock line so that the next transition, at 42, can signal to the logic circuit that valid data has again been placed onto the DO data output on line 24.

Although it is not shown in FIG. 2, additional pages of data can be read from the memory system by setting and resetting the page select PGN line, and ensuring that the correct address and WN signals are present each time. Whenever PGN signals a new page cycle by changing state (as at time 38), the DDL/SDI signal is reset (as at 40). In each case, the logic circuit waits until DDL/SDI again changes state (as at 34 and 42) signaling that the output data is now valid and the logic circuit can proceed.

If a very large block of data is being read in sequence, the entire block of data will be read, page by page, through the cycling of the PGN signal and the changing of the low order bits of the address. Ultimately, the logic circuit will need to read data that has not already been retrieved during the macro cycle begun at 28. At this point, a new macro cycle must be initiated to retrieve new data, which can then be read a page at a time.

In order to end the current macro cycle, MSN, PGN and DDL/SDI are all reset. At the points marked with reference numerals 44, 46 the MSN and PGN signals change state. At time 48 the DDL/SDI interlock signal is reset responsive to the MSN and PGN resets.

FIG. 2 has described the operation of this invention during a read cycle, and some embodiments of the invention may use the DDL/SDI handshaking operation described only during read operations. Specifically, the handshake starts with the logic circuit requesting a read operation through MSN or PGN. The memory system responds when data is ready through the DDL/SDI interlock signal, and the logic circuit signals the memory system to reset DDL/SDI by starting a new read cycle via PGN as at 38 or by changing the state of MSN as shown at 44.

The complete read operation will generally occur much faster for a page cycle read than for a macro cycle read. Further, some macro cycle read operations will take more time than others due to the different storage locations and the different distances of those storage locations from the outputs. Regardless of the source of the variation, however, DDL/SDI will signal when the data becomes valid, and the logic circuit will be able to immediately proceed to use the data.

Even where the embedded macro is operated outside of its intended operating parameters, for example under extremes of heat or low voltage, the macro may continue to function because the logic circuit will be signaled to wait for valid data. The macro is thereby improved in reliability of operation as well as in speed of operation under normal conditions, and at all times the macro runs optimally.

The handshaking operation description above is implemented using conventional logic techniques in the logic circuit 10 and the memory system 12. The logic circuit simply waits for the signal on the DDL/SDI line 26 before initiating the next operation which it does at the next clock signal.

The memory system merely needs to reset the DDL/SDI signal at an appropriate time which may be at time 38 on the page select signal or at time 44 on the macro select signal.

Although some designers may elect to use the invention only to increase the performance of read operations, in a more sophisticated and more highly preferred implementation of the invention, the memory system 12 will also be provided with an internal method of determining when write operations have been successfully completed. In these embodiments, the memory system will be provided with an internal write interlock signal corresponding to the read interlock signal previously described. The write interlock signal will indicate when a write operation has successfully written data, such that the logic circuit may begin a new write (or read) operation.

FIG. 3 illustrates the operation of a preferred embodiment of the system incorporating write operation interlocking in the memory system 12.

At point 50, a new macro cycle begins during which a write operation will proceed. Immediately prior to the change of state of the macro select signal at point 50, the write enable signal WN will be set low (indicating that this is a write operation). The low state of the write enable signal at point 50 can be compared with the high state of the write enable signal at point 30 in FIG. 2 (during a read operation).

Prior to the change of state of the macro select signal at 50, the data to be written will be placed upon the data input DI as indicated at time 54. Prior to this time, it does not matter what data is on DI (as indicated by the slashes prior to time 54). As in the case of the read operation, the logic circuit will also place the appropriate address upon the address lines to tell the memory system where to store the data.

The transition of the macro select signal at time 50 causes the memory system 12 to store the data on DI in the location designated by the address. Once the data has been successfully written, the memory system 12 signals this fact via the DDL/SDI line as indicated at point 56.

When the logic circuit 10 sees the change of state of the DDL/SDI line, it can proceed with a subsequent write or read operation. Resetting of the system data interlock signal, and the operation of page cycles to write data is substantially the same as described in connection with the read operation.

A page cycle begins at time 58 by changing the state of PGN. As in the case of a page read, before this point, the logic circuit must set write enable and specify the address. Data to be written must also be applied to the data inputs as in the macro write cycle. Write enable is set low as shown at 60. Data to be written during this page cycle is set on the data input as shown at 62.

When the page select signal changes state at 58, the memory system 12 immediately resets the DDL/SDI line as indicated with reference numeral 64. Once the page of data has been successfully written, the memory system signals this to the logic circuit by changing the state of DDL/SDI as indicated at 66.

Additional page cycles can continue writing to new addresses which differ from the previous write operations only in the low order bits. When it is necessary to change the high order bits in the address, a new macro cycle must be initiated by changing the state of the macro select signal as indicated at 68. This resets the DDL/SDI system data interlock signal as shown at 70 and the process continues with a new macro read or write cycle.

FIG. 4 shows how a combined write/read operation for one or more pages of data may be accomplished during a single macro cycle. Initially a page of data is written, and immediately thereafter, a page of data is read.

At time 72, a new macro cycle begins. This is a write operation as signaled by the write enable line WN at 74, and the data to be written is placed upon the DI line as shown at 76. At 78, DDL/SDI signals a successful completion of the write operation. The logic circuit then decides to read a page of data and switches the state of WN at point 80 and initiates a new page cycle with PGN at 82. This causes the memory system to reset DDL/SDI at 84 and begin the read operation.

When the data has been read, the memory system places the data on the data output at point 86 and signals the logic circuit that the data is now valid and can be used by changing the state of DDL/SDI at 88. As in the previous case, the change of state of the macro select signal MSN and/or the page select signal PGN at 90 and 92, causes the system data interlock signal to be reset as shown at 94.

Figure 5:
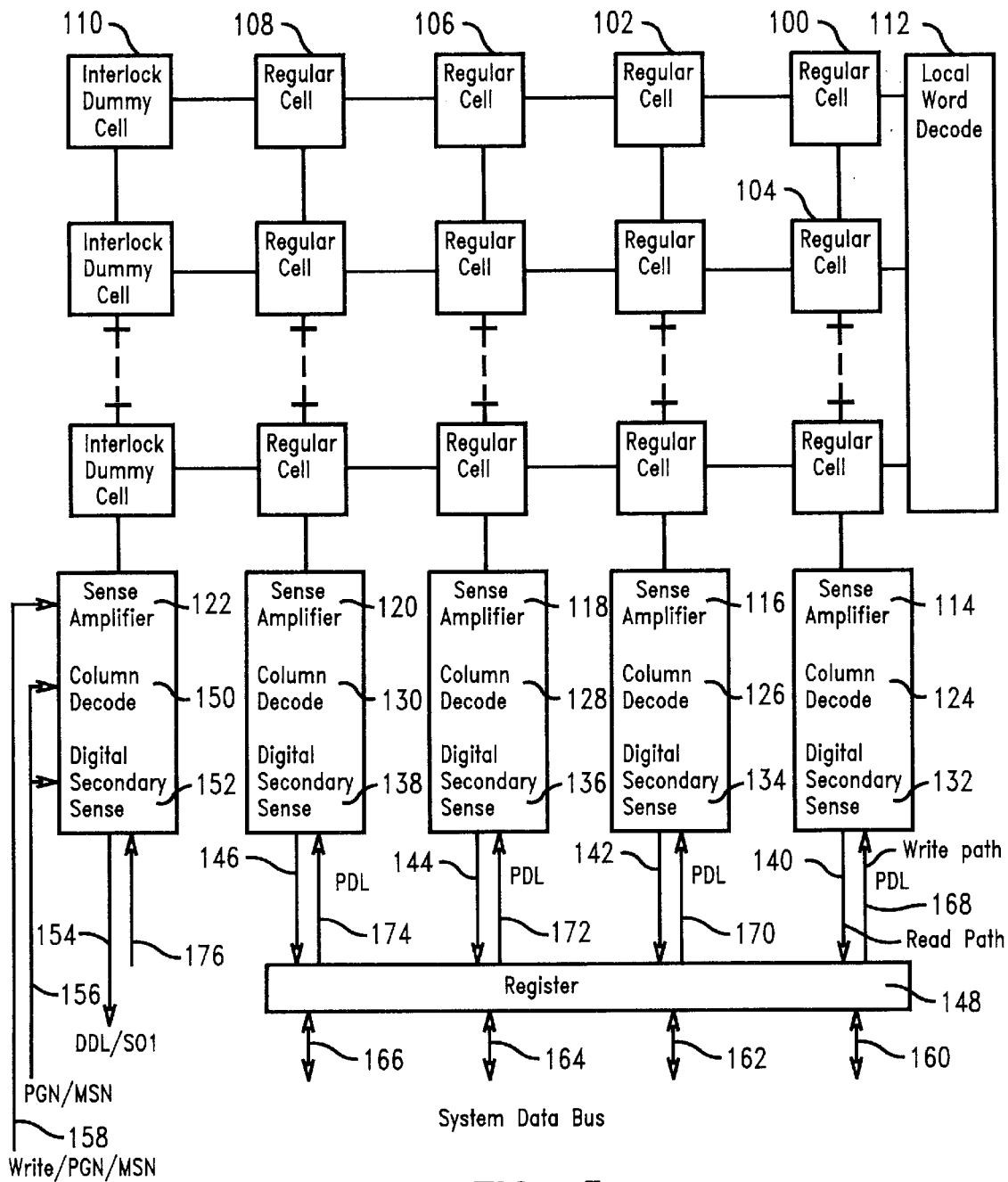
FIG. 5 is a partial block diagram of a memory system constructed in accordance with the present invention showing data flow during read and write operations.

FIG. 5 illustrates the block diagram of a portion of a memory system 12 suitable for use in the present invention. Each binary bit of data to be stored in the memory system is stored in a separate memory cell marked as a "Regular Cell". The memory cells are arranged in rows and columns, thus, memory cell 100 is located in the upper row of FIG. 5 and in the rightmost column. Memory cell 102 is located in the same row as memory cell 100, but in the adjacent column. Memory cell 104 is located in the same column as memory cell 100 but in a different row.

Although FIG. 5 only illustrates three rows and four columns, it will be understood that in a large memory system, the number of rows and number of columns will be increased significantly. For example, a modern memory system may have 2,000 cells in a single row. During a read operation, the high order bits in the addresses are decoded by the local word decoder 112 to identify the row containing the desired data. For this example, we will assume that this is the first row. This row contains memory cells 100, 102, 106 and 108 and an interlock dummy cell 110 located at the far left hand side at the most distant location from the local word decoder 112.

The operation of the MSN signal causes sense amplifiers 114, 116, 118, 120 and 122 to read the data in the row identified by the high order bits of the address as decoded by the local word decoder 112. Thus the sense amplifiers 114, 116, 118, 120 and 122 read the corresponding memory cells 100, 102, 106, 108 and 110. The data from regular memory cell 100 will arrive in sense amplifier 114 before the data from regular cells 102, 106 and 108 arrives in their corresponding sense amplifiers.

Sense amplifier 122, however, which corresponds to interlock dummy cell 110 will change state last, and only after all of other regular cells have been read and after all of their corresponding sense amplifiers have changed state to match the data in their corresponding regular cells.

The data stored in interlock dummy cell 110 is a predefined bit of data selected so that the state of sense amplifier 122 always changes when the dummy cell is read. When sense amplifier 122 changes state, it is known that all of the other sense amplifiers contain valid data. At this point, the sense amplifiers act as a form of internal register holding the data in the corresponding address row. As indicated previously, this may include 2048 bits of data.

However, typically the memory system will not include 2048 data outputs and may include only 256 or fewer outputs. The column decoders 124, 126, 128 and 130 are used to decode the lower order bits of the address and to select a subset of the memory cells in the selected row. Where there are 256 data outputs, and 2048 regular memory cells in a row, there will be 2048 sense amplifiers (not counting the interlock dummy cell 110 and its corresponding sense amplifier 122. However, there will only be 256 column decoders, each column decoder being connected to eight separate sense amplifiers.

The lower order bits of the address will determine which of the sense amplifiers are selected through the column decoder and after this selection is made, the digital secondary sense amplifiers 132, 134, 136 and 138 will transfer the selected data through the predata lines 140, 142, 144 and 146 into the register 148.

The column decoder 150 connected to sense amplifier 122 in the column containing the interlock dummy cells does not actually perform a column decoding function. Instead, it is made substantially identical to the column decoders 124–130 so that the delay in passing the signal from sense amplifier 122 through to the digital secondary sense amplifier 152 is substantially identical to the delay caused by the column decoders 124–130.

In this way the output from digital secondary sense amplifier 152 will indicate when the register 148 has been successfully loaded. The data from rows located very close to the register 148 will cause an early transition of the DDL/SDI line, whereas data located in distant rows will take longer. Because the DDL/SDI line 154 corresponds to the data lines 140–146, but carries dummy data from a dummy data cell, it is often referred to as the dummy data line.

Line 154 has been marked DDL/SDI, however, it will be understood that the binary signal on this line may undergo additional processing before producing the system data interlock signal transferred to the logic circuit on line 26 of FIG. 1.

The combination of a sense amplifier, column decoder and digital secondary sense amplifier may generally be seen as a control circuit for passing data to and from the memory cells. This control circuit has a delay time that depends, in part, upon the location of the memory cell, and in part upon the application and process variations. The control circuit for the dummy data is designed so that it introduces at least the same delay, as the delay from the other control circuits when exposed to the same application and process. This leaves the delay due to the more distant location of the interlock dummy cell from the local word decoder 112 to ensure that data from the interlock dummy cell arrives last at the DDL/SDI line.

As previously described, during a page read cycle, it is not necessary to reread the entire row of data, because sense amplifiers 114–122 have already been loaded with data from the corresponding row. Thus, the time necessary for the local word decoding function in 112, as well as the time for the sense amplifiers 114–122 to change state can all be eliminated. All that is necessary during a page read cycle is to decode the changed lower order bits in the address. The column decoders then select a new subset for data from the sense amplifiers, and that data is loaded into register 148.

Lines 156 and 158 generally indicate how the system data interlock signal DDL/SDI is reset. Standard logic functions are used to monitor the write enable WN, page select PGN and macro select MSN signals to perform the reset of DDL/SDI under the conditions and at the times described in connection with FIGS. 2–4. The reset signal for resetting sense amplifier 122 is carried over line 158. The reset signal for resetting the column decoder 150 and the digital secondary sense amplifier 152 is carried over line 156.

Once the output register 148 has been loaded, the system databus, including lines 160, 162, 164 and 166 are used to send the data to the data output. Although these lines have been shown to be bi-directional, they may comprise separate input and output lines.

During a write operation, data will be written into the register 148 from the data inputs. From register 148, the data flows via the predata lines 168, 170, 172 and 174 through the digital secondary sense amplifiers, out the column decoders and into the corresponding sense amplifiers. From there the data goes into the specified memory cells.

In prior art designs, this operation has not been interlocked, however, in the preferred embodiment of the present design, predetermined data is fed via line 176 into digital secondary sense amplifier 152, on to column decoder 150 and into the sense amplifier 122 that corresponds to the interlock dummy memory cell 110. When the sense amplifier 122 changes state, the signal returns as described previously through DDL/SDI line 154 providing a write interlock signal.

The predetermined write data is chosen, and the circuit is designed to cause the DDL/SDI line 154 to change state, as occurred during the read operation interlocking. The change of state on DDL/SDI occurs only after the corresponding data has been successfully written into the regular memory cells. Thus, line 154 acts as both a read interlock and a write interlock signal.

The memory system used in connection with this invention will often be a dynamic random access memory (DRAM) system, however, it may also be used with other types of memory systems.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An embedded memory macro device comprising:
    a semiconductor substrate;
    a memory system constructed on the semiconductor substrate, the memory system including:
        an array of memory cells for storing data,
        a data output for making data available after data has been read from the memory cells, and
        a system data interlock output having a system data interlock signal indicating the presence of valid data at the data output, the system data interlock signal indicating valid data earlier when valid data arrives faster at the data output, and indicating valid data later when valid data has taken longer to arrive at the data output; and
        a logic circuit constructed on the semiconductor substrate with the memory system and connected to the data output and the system data interlock output, the logic circuit reading data at the data output only after the system data interlock signal indicates the presence of valid data at the data output.

2. An embedded memory macro device according to claim 1 wherein:
    the logic circuit defines macro cycles during which data is read from the memory system;
    the logic circuit further includes a macro select output having a macro select signal indicating a new macro cycle; and
    the memory system is connected to the macro select output and resets the system data interlock signal to indicate the absence of valid data at the data output responsive to the macro select signal.

3. An embedded memory macro device according to claim 2 wherein:
    the memory system retrieves a block of data from the memory cells during a macro cycle;
    the logic circuit defines page cycles during which a subset of the block of data retrieved by the memory system is read by the logic circuit;

the logic circuit further includes a page select output having a page select signal indicating a new page cycle; and the memory system is connected to the page select output and resets the system data interlock signal to indicate the absence of valid data at the data output responsive to the page select signal.

4. An embedded memory macro device according to claim 3 wherein:

the page select signal includes first and second states, the page select signal alternately transitions from the first state to the second state and from the second state to the first state during a page cycle; and the memory system resets the system data interlock signal to indicate the absence of valid data during at least one of the transitions of state by the page select signal.

5. An embedded memory macro device according to claim 4 wherein the system data interlock signal is derived from a dummy data line in the memory system.

6. An embedded memory macro device according to claim 3 wherein:

the macro select signal includes first and second states, the macro select signal alternately transitions from the first state to the second state and from the second state to the first state during a macro cycle;

the memory system resets the system data interlock signal to indicate the absence of valid data during at least one of the transitions of state by the page select signal.

7. An embedded memory macro device according to claim 1 wherein:

the array of memory cells is organized into rows and columns, each row including a corresponding interlock dummy cell having a selected position in the corresponding row and storing therein a bit of fixed data;

the interlock dummy cells are connected through a control circuit to the system data interlock output;

the system data interlock signal includes first and second states indicating the presence or absence of valid data at the data output;

the position of each interlock dummy cell in the corresponding row and the value of the bit of fixed data in each interlock dummy cell is selected to ensure that the system data interlock signal changes state to indicate the presence of valid data at the data output only after data from the corresponding row has become valid at the data output.

8. An embedded memory macro device according to claim 7 wherein the memory system includes a word decoder for selecting a particular row of memory cells and the interlock dummy cell corresponding to the particular row of memory cells is located at an opposite end of the particular row of memory cells from the word decoder.

9. An embedded memory macro device according to claim 8 wherein:

each memory cell in a selected row is connected through a corresponding control circuit having a delay time for data passing from the memory cell through the corresponding control circuit;

the control circuit for the interlock dummy cell in the selected row has a delay time for the fixed data passing through the control circuit for the interlock dummy cell; and the delay time of the control circuit for the interlock dummy cell is at least as long as the delay time for each corresponding control circuit.

10. An embedded memory macro device according to claim 8 wherein the control circuit includes a sense amplifier, a column decoder and a digital secondary sense amplifier.

11. An embedded memory macro device according to claim 10 wherein:

the logic circuit includes a macro select output having a macro select signal indicating a macro cycle during which data is read from the memory system; and the column decoder and digital secondary sense amplifier of the control circuit are connected to the macro select output and reset the system data interlock signal to indicate the absence of valid data at the data output upon receipt of the macro select signal.

12. An embedded memory macro device according to claim 1 wherein:

the memory system further includes a data input for receiving data from the logic circuit to be stored in the memory cells;

the logic circuit further includes a write enable output connected to the memory system, the write enable output having a write enable signal indicating to the memory system that data at the data input is to be stored; and the memory system uses the system data interlock signal to signal the logic circuit that the data has been validly written into the memory cells.

13. An embedded memory macro device according to claim 12 wherein:

the logic circuit defines macro cycles during which data is read from the memory system;

the logic circuit further includes a macro select output having a macro select signal indicating a new macro cycle; and the memory system is connected to the macro select output and resets the system data interlock signal to indicate the absence of valid data at the data output responsive to the macro select signal.

14. An embedded memory macro device according to claim 13 wherein:

the memory system retrieves a block of data from the memory cells during a macro cycle;

the logic circuit defines page cycles during which a subset of the block of data retrieved by the memory system is read by the logic circuit;

the logic circuit further includes a page select output having a page select signal indicating a new page cycle; and the memory system is connected to the page select output and resets the system data interlock signal to indicate the absence of valid data at the data output responsive to the page select signal.

15. An embedded memory macro device according to claim 14 wherein:

the page select signal includes first and second states, the page select signal alternately transitioning from the first state to the second state and from the second state to the first state during a page cycle;

the memory system resets the system data interlock signal to indicate the absence of valid data during at least one of the transitions of state by the page select signal.

16. An embedded memory macro device according to claim 15 wherein the system data interlock signal is at least partly derived from a dummy data line in the memory system.

17. An embedded memory macro device according to claim 12 wherein:

the array of memory cells is organized into rows and columns, each row including a corresponding interlock dummy cell having a selected position in the corresponding row and storing therein a bit of fixed data;

the interlock dummy cells are connected through a control circuit to the system data interlock output;

the position of each interlock dummy cell in the corresponding row and the value of the bit of fixed data in each interlock dummy cell being selected to ensure that the system data interlock signal changes state to indicate the presence of valid data at the data output only after data from the corresponding row has become valid at the data output.

18. An embedded memory macro device comprising:

a semiconductor substrate;

a memory system constructed on the semiconductor substrate, the memory system including:
an array of memory cells for storing data,
a data input for storing data in the memory cells, and
a system data interlock output having a system data interlock signal indicating that data at the data input has been validly written into the memory cells, the system data interlock signal indicating a valid write earlier when data has been validly written faster and indicating a valid write later when data has taken longer to be validly written; and a logic circuit constructed on the semiconductor substrate with the memory system and connected to the data input and the system data interlock output, the logic circuit providing new data to the data input only after the system data interlock signal indicates that the data has been validly written into the memory cells.

19. An embedded memory macro device according to claim 18 wherein:

the logic circuit defines macro cycles during which data is written into the memory system;

the logic circuit further includes a macro select output having a macro select signal indicating a new macro cycle; and the memory system is connected to the macro select output and resets the system data interlock signal to indicate that data has not been written into the memory cells responsive to the macro select signal.

20. An embedded memory macro device according to claim 19 wherein:

during macro cycles the logic circuit reads or writes data from or to the memory system;

the logic circuit includes a write enable output connected to the memory system, the logic circuit providing a write enable signal at the write enable output indicating whether the logic circuit is reading or writing data during each macro cycle;

the memory system uses the system data interlock signal to signal the logic circuit that data has been successfully written or read during each macro cycle; and the logic circuit proceeds with a subsequent read or write operation only after a successful previous read or write operation has been signaled by the memory system via the system data interlock signal.

* * * * *

UNITED STATES PATENT AND TRADEMARK OFFICE
CERTIFICATE OF CORRECTION

PATENT NO.  :  6,044,024
DATED       :  March 28, 2000
INVENTOR(S) :  Barth et al.

It is certified that error appears in the above-identified patent and that said Letters Patent is hereby corrected as shown below:

On the title page, item [56],

References cited:

Please insert -- 5,325,330   D. M. Morgan        06/28/94
                 5,490,114   E. Butler et al.    02/06/96
                 5,546,344   A. R. Fawcett       08/13/96
           and   WO97/08702  PCT                 03/06/97 --

Signed and Sealed this

Thirteenth Day of February, 2001

Attest:

NICHOLAS P. GODICI

Attesting Officer    Acting Director of the United States Patent and Trademark Office